(12) United States Patent
Takahashi et al.

(10) Patent No.: US 7,825,039 B2
(45) Date of Patent: Nov. 2, 2010

(54) VERTICAL PLASMA PROCESSING METHOD FOR FORMING SILICON CONTAINING FILM

(75) Inventors: Toshiki Takahashi, Oshu (JP); Kohei Fukushima, Oshu (JP); Koichi Orito, Oshu (JP); Jun Sato, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 34 days.

(21) Appl. No.: 12/411,123

(22) Filed: Mar. 25, 2009

(65) Prior Publication Data

US 2009/0181548 A1     Jul. 16, 2009

Related U.S. Application Data

(62) Division of application No. 11/696,501, filed on Apr. 4, 2007, now abandoned.

(30) Foreign Application Priority Data

Apr. 5, 2006  (JP)  ............................. 2006-104730
Apr. 19, 2006 (JP)  ............................. 2006-116021

(51) Int. Cl.
*H01L 21/471*    (2006.01)

(52) U.S. Cl. ............................. 438/778; 257/E21.493; 427/255.395

(58) Field of Classification Search .......... 257/E21.493; 427/255.395
See application file for complete search history.

(56) References Cited

U.S. PATENT DOCUMENTS

| 6,350,708 | B1 * | 2/2002 | Hurley | 438/791 |
| 6,881,684 | B2 * | 4/2005 | Aota et al. | 438/791 |
| 7,129,187 | B2 * | 10/2006 | Joe | 438/769 |
| 2003/0049372 | A1 | 3/2003 | Cook et al. | |
| 2005/0130448 | A1 * | 6/2005 | Olsen et al. | 438/786 |
| 2005/0287775 | A1 | 12/2005 | Hasebe et al. | |

FOREIGN PATENT DOCUMENTS

| JP | 6-45256 | 2/1994 |
| JP | 11-87341 | 3/1999 |
| WO | WO 2004/066377 A1 | 8/2004 |

* cited by examiner

*Primary Examiner*—Stephen W Smoot
(74) *Attorney, Agent, or Firm*—Oblon, Spivak, McClelland, Maier & Neustadt, L.L.P.

(57) ABSTRACT

A vertical plasma processing apparatus for a semiconductor process includes a process container having a process field configured to accommodate a plurality of target substrates at intervals in a vertical direction, and a marginal space out of the process field. In processing the target substrates, a control section simultaneously performs supply of a process gas to the process field from a process gas supply circuit and supply of a blocking gas to the marginal space from a blocking gas supply circuit to inhibit the process gas from flowing into the marginal space.

12 Claims, 7 Drawing Sheets

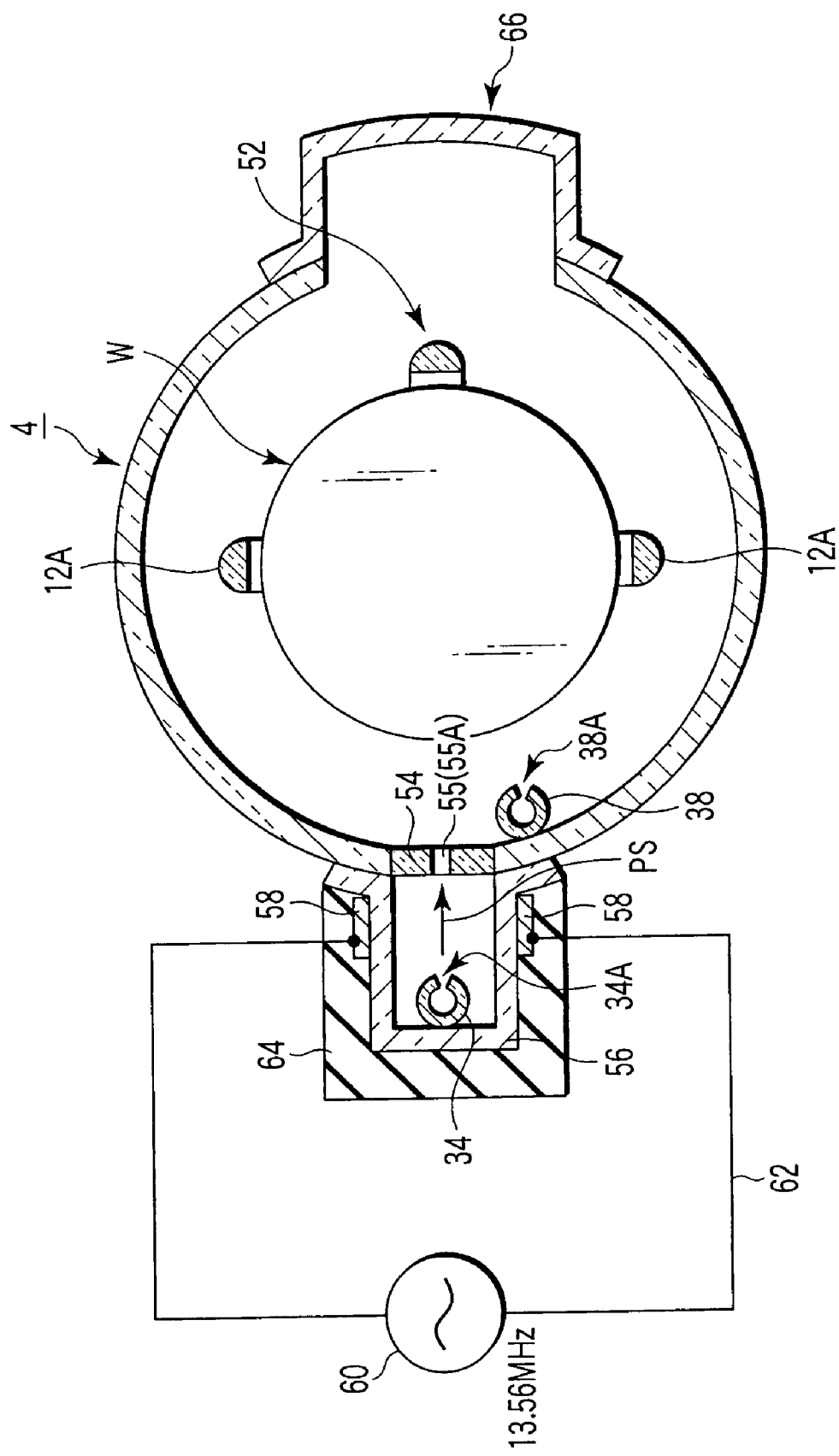
F I G. 2

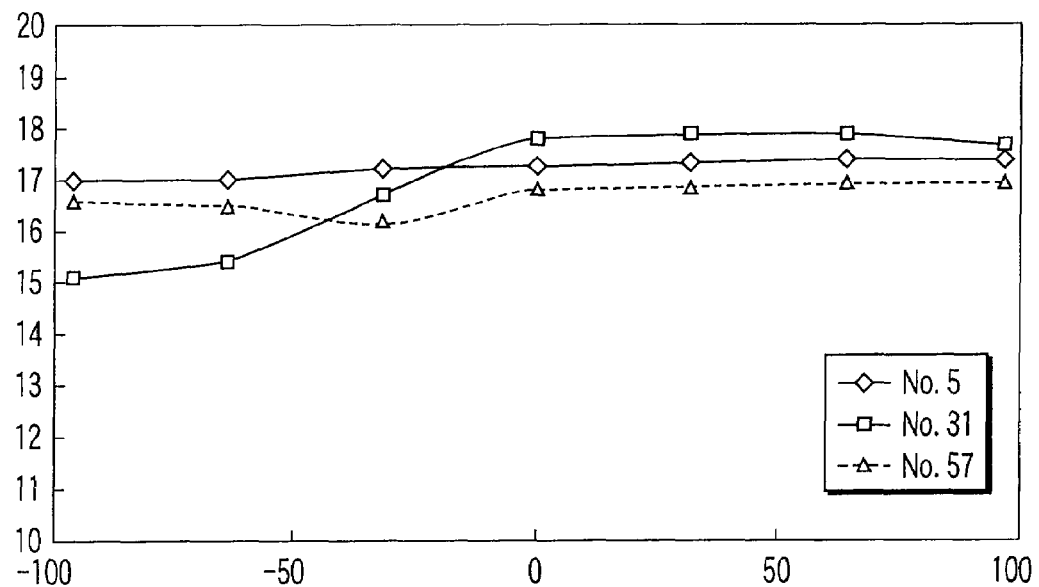
F I G. 8
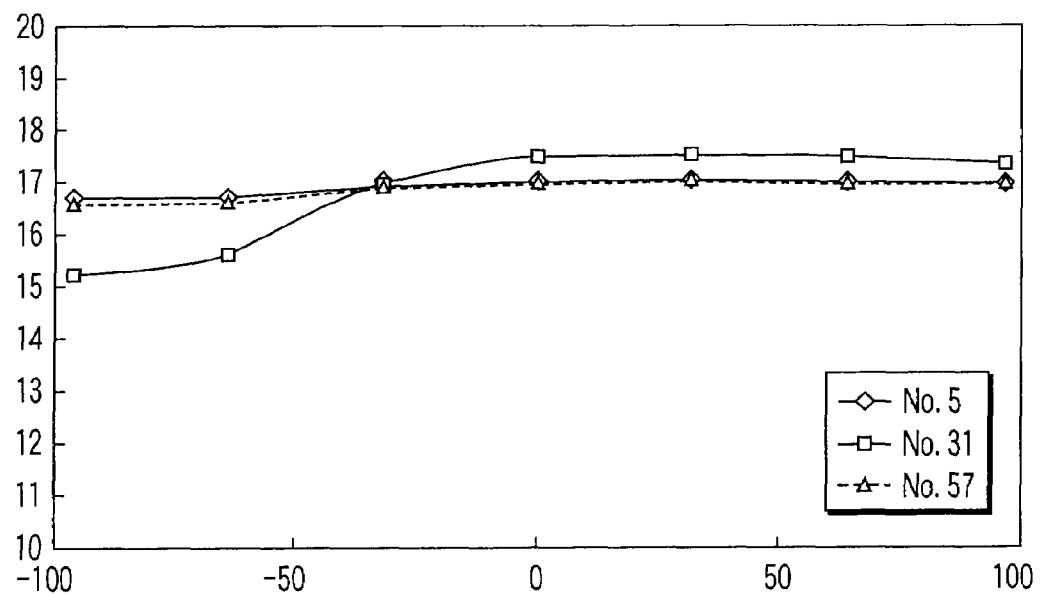
F I G. 9

VERTICAL PLASMA PROCESSING METHOD FOR FORMING SILICON CONTAINING FILM

CROSS-REFERENCE TO RELATED APPLICATIONS

This application is a divisional Application of, and claims the benefit of priority under 35 U.S.C. §120 from, U.S. application Ser. No. 11/696,501, filed Apr. 4, 2007, now abandoned which claims the benefit of priority under 35 U.S.C. §119 from prior Japanese Patent Applications No. 2006-104730, filed Apr. 5, 2006 and No. 2006-116021, filed Apr. 19, 2006. The entire contents of each of the above applications are incorporated herein by reference.

BACKGROUND OF THE INVENTION

1. Field of the Invention

The present invention relates to a vertical plasma processing apparatus and method for a semiconductor process, such as a vertical plasma film formation apparatus and method for forming a thin film, such as a silicon-containing insulating film, on a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor devices for constituting semiconductor integrated circuits, a target substrate, such as a semiconductor wafer (made of, e.g., silicon) is subjected to various processes, such as film formation, etching, oxidation, diffusion, reformation, annealing, and natural oxide film removal. US 2003/0224618 A1 discloses a semiconductor processing method of this kind performed in a vertical heat-processing apparatus (of the so-called batch type). According to this method, semiconductor wafers are first transferred from a wafer cassette onto a vertical wafer boat and supported thereon at intervals in the vertical direction. The wafer cassette can store, e.g., 25 wafers, while the wafer boat can support 30 to 150 wafers. Then, the wafer boat is loaded into a process container from below, and the process container is airtightly closed. Then, a predetermined heat process is performed, while the process conditions, such as process gas flow rates, process pressures, and process temperatures, are controlled.

In recent years, owing to the demands of increased miniaturization and integration of semiconductor integrated circuits, it is required to alleviate the thermal history of semiconductor devices in manufacturing steps, thereby improving the characteristics of the devices. For vertical processing apparatuses, it is also required to improve semiconductor processing methods in accordance with the demands described above. For example, there is a CVD (Chemical Vapor Deposition) method for a film formation process, which performs film formation while intermittently supplying a source gas and so forth to repeatedly form layers each having an atomic or molecular level thickness, one by one, or several by several (for example, Jpn. Pat. Appln. KOKAI Publications No. 6-45256 and No. 11-87341). In general, this film formation method is called ALD (Atomic layer Deposition), which allows a predetermined process to be performed without exposing wafers to a very high temperature.

Further, WO 2004/066377 (Dec. 15, 2004), which corresponds to U.S. Pat. No. 7,094,708 B2, discloses a structure of a vertical processing apparatus for performing ALD, which utilizes plasma processing assistance to further decrease the process temperature. According to this apparatus, for example, where dichlorosilane (DCS) and $NH_3$ are used as a silane family gas and a nitriding gas, respectively, to form a silicon nitride film (SiN), the process is performed, as follows. Specifically, DCS and $NH_3$ gas are alternately and intermittently supplied into a process container with purge periods interposed therebetween. When $NH_3$ gas is supplied, an RF (radio frequency) is applied to generate plasma so as to promote a nitridation reaction. More specifically, when DCS is supplied into the process container, a layer with a thickness of one molecule or more of DCS is adsorbed onto the surface of wafers. The superfluous DCS is removed during the purge period. Then, $NH_3$ is supplied and plasma is generated, thereby performing low temperature nitridation to form a silicon nitride film. These sequential steps are repeated to complete a film having a predetermined thickness.

BRIEF SUMMARY OF THE INVENTION

An object of the present invention is to provide a vertical plasma processing apparatus and method for a semiconductor process, which can improve the process gas usage rate and process throughput without adversely affecting the process field.

Another object of the present invention is to provide a vertical plasma processing apparatus and method for a semiconductor process, which can improve the planar uniformity and/or inter-substrate uniformity of a plasma process performed on a target substrate.

According to a first aspect of the present invention, there is provided a vertical plasma processing apparatus for a semiconductor process, the apparatus comprising:

a process container having a process field configured to accommodate a plurality of target substrates at intervals in a vertical direction, and a marginal space out of the process field;

a support member configured to support the target substrates inside the process field;

an exciting mechanism including a plasma generation area disposed in a space communicating with the process field, the plasma generation area extending over a length corresponding to the process field in a vertical direction;

a process gas supply circuit configured to supply a process gas to the process field, such that the process gas is exited while passing through the plasma generation area, and the process gas is supplied to the process field to form essentially horizontal gas flows;

an exhaust system configured to exhaust gas from the process field, and including an exhaust port facing the plasma generation area with the process field interposed therebetween;

a blocking gas supply circuit configured to supply a blocking gas to the marginal space, such that the blocking gas is not supplied directly to the process field but is supplied directly to the marginal space; and a control section configured to control an operation of the apparatus, wherein, in processing the target substrates, the control section simultaneously performs supply of the process gas to the process field from the process gas supply circuit and supply of the blocking gas to the marginal space from the blocking gas supply circuit to inhibit the process gas from flowing into the marginal space.

According to a second aspect of the present invention, there is provided a processing method in a vertical plasma processing apparatus for a semiconductor process, the apparatus including a process container having a process field configured to accommodate a plurality of target substrates at intervals in a vertical direction, and a marginal space out of the process field, a support member configured to support the target substrates inside the process field, an exciting mechanism including a plasma generation area disposed in a space communicating with the process field, the plasma generation area extending over a length corresponding to the process field in a vertical direction, a process gas supply circuit configured to supply a process gas to the process field, such that the process gas is exited while passing through the plasma generation area, and the process gas is supplied to the process field to form essentially horizontal gas flows, an exhaust system configured to exhaust gas from the process field, and including an exhaust port facing the plasma generation area with the process field interposed therebetween, and a blocking gas supply circuit configured to supply a blocking gas to the marginal space, such that the blocking gas is not supplied directly to the process field but is supplied directly to the marginal space, the method comprising: processing the target substrates while simultaneously performing supply of the process gas to the process field from the process gas supply circuit and supply of the blocking gas to the marginal space from the blocking gas supply circuit to inhibit the process gas from flowing into the marginal space.

According to a third aspect of the present invention, there is provided a vertical plasma processing apparatus for a semiconductor process, the apparatus comprising:

a process container having a process field configured to accommodate a plurality of target substrates at intervals in a vertical direction, and a marginal space out of the process field;

a support member configured to support the target substrates inside the process field;

a heater configured to heat the target substrates inside the process field;

an exciting mechanism including a plasma generation area disposed in a space communicating with the process field, the plasma generation area extending over a length corresponding to the process field in a vertical direction;

a process gas supply system configured to selectively supply into the process field a first process gas that provides a main material of a thin film and a second process gas that reacts with the first process gas, so as to deposit the thin film on the target substrates, such that at least one of the first and second process gases is exited while passing through the plasma generation area, and the first and second process gases are supplied to the process field to form essentially horizontal gas flows;

an exhaust system configured to exhaust gas from the process field, and including an exhaust port facing the plasma generation area with the process field interposed therebetween;

a blocking gas supply circuit configured to supply a blocking gas to the marginal space, such that the blocking gas is not supplied directly to the process field but is supplied directly to the marginal space; and a control section configured to control an operation of the apparatus, wherein, in order to deposit the thin film on the target substrates, the control section executes supply of the first process gas to the process field and supply of the second process gas to the process field, repeatedly a plurality of times, while simultaneously performing supply of each of the first and second process gases to the process field from the process gas supply system and supply of the blocking gas to the marginal space from the blocking gas supply circuit to inhibit the first and second process gases from flowing into the marginal space.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 2 is a sectional plan view showing part of the apparatus shown in FIG. 1;

FIG. 8 is a graph showing the relationship between the position on a wafer and the film thickness obtained by the apparatus shown in FIG. 5 in Experiment 2;

FIG. 9 is a graph showing the relationship between the position on a wafer and the film thickness obtained by the apparatus shown in FIG. 5 in Experiment 3;

DETAILED DESCRIPTION OF THE INVENTION

Figure 1:
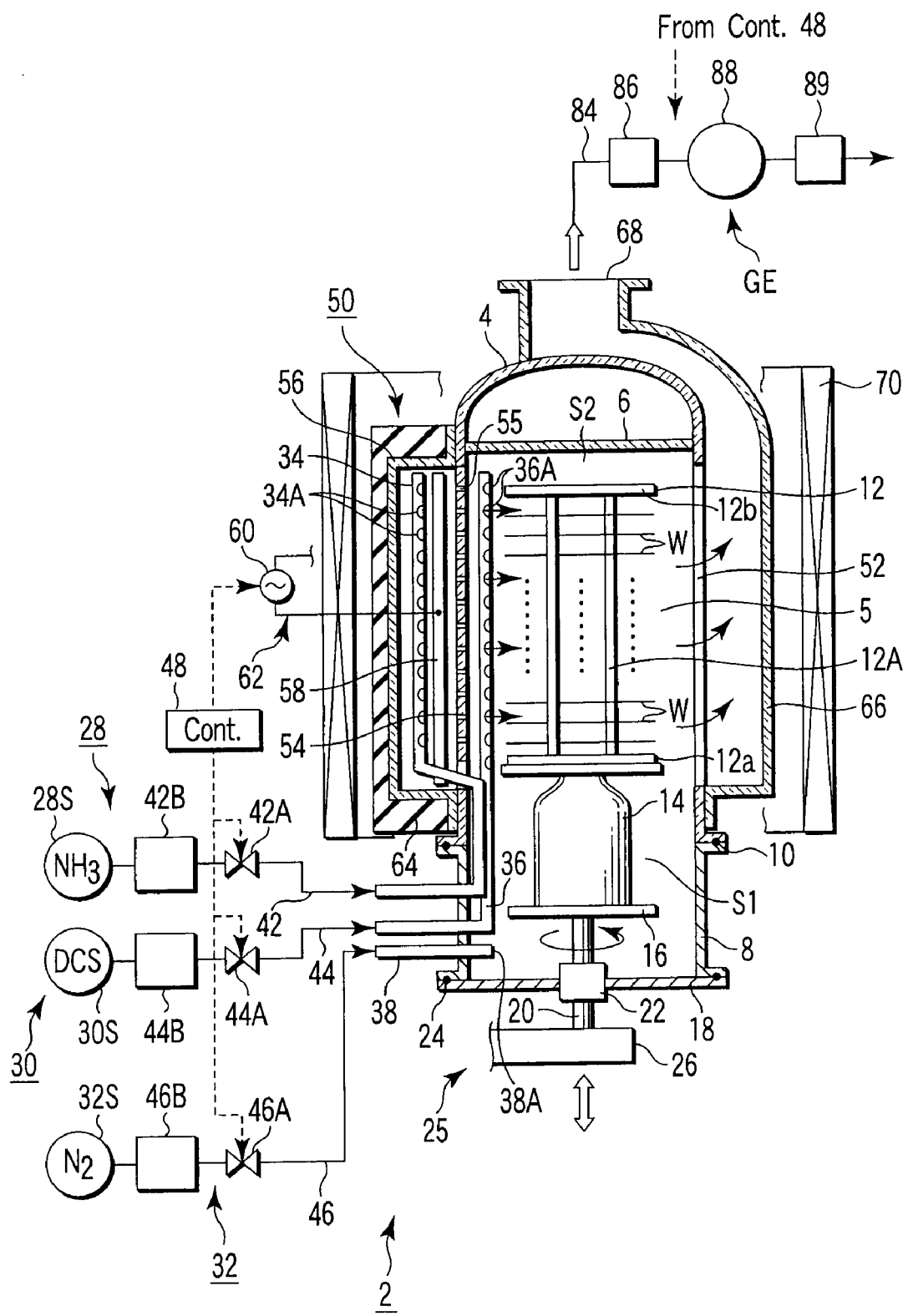
FIG. 1 is a sectional view showing a vertical plasma processing apparatus (vertical plasma film formation apparatus) according to a first embodiment of the present invention.

In the process of developing the present invention, the inventors studied problems caused in vertical plasma processing apparatuses, as those disclosed in WO 2004/066377 and so forth. As a result, the inventors have arrived at the findings given below.

In general, the process container of a vertical plasma processing apparatus has a marginal space out of a process field configured to accommodate a plurality of wafers at intervals in the vertical direction. In the case of the apparatus disclosed in WO 2004/066377, the marginal space comprises a lower space and an upper space respectively present below and above the process field. The lower space and upper space respectively correspond to a space below the bottom plate of a wafer boat for supporting wafers and a space above the top plate thereof. During a process, a process gas is supplied and exhausted essentially uniformly in the horizontal direction, so as to form gas flows parallel with the wafers. Even so, part of the process gas flows into the lower space and upper space and stays there, and then is exhausted without making a contribution to the process reaction.

Where part of the process gas stays in the marginal space, it is necessary to prolong the purge period (vacuum-exhaust time) for removing this gas part. In this case, the process throughput is decreased to a large extent, particularly in a processing method of the ALD type described above, in which process gas supply periods and purge periods are alternately repeated. Further, where part of the process gas flows into the marginal space, useless consumption of the process gas, which is relatively expensive, is increased, and the running cost is thereby increased to a large extent. In addition, as described later, where part of the process gas flows into the marginal space, the process gas creates local flows, which deteriorate the planar uniformity and/or inter-substrate uniformity of the plasma process on wafers.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

First Embodiment

FIG. 1 is a sectional view showing a vertical plasma processing apparatus (vertical plasma film formation apparatus) according to a first embodiment of the present invention. FIG. 2 is a sectional plan view showing part of the apparatus shown in FIG. 1. The film formation apparatus 2 has a process field configured to be selectively supplied with a first process gas containing dichlorosilane (DCS) gas as a silane family gas, a second process gas containing ammonia ($NH_3$) gas as a nitriding gas, and a purge gas comprising an inactive gas, such as $N_2$ gas. The film formation apparatus 2 is configured to form a silicon nitride film on target substrates by CVD in the process field.

The apparatus 2 includes a process container 4 shaped as a cylindrical column with a ceiling and an opened bottom, in which a process field 5 is defined to accommodate and process a plurality of semiconductor wafers (target substrates) stacked at intervals. The process container 4 further includes a marginal space out of the process field 5, which comprises a lower space S1 and an upper space S2 respectively present below and above the process field 5, in this embodiment.

The entirety of the process container 4 is made of, e.g., quartz. The top of the process container 4 is provided with a quartz ceiling plate 6 to airtightly seal the top. The bottom of the process container 4 is connected through a seal member 10, such as an O-ring, to a cylindrical manifold 8. The process container may be entirely formed of a cylindrical quartz column without a manifold 8 separately formed.

The cylindrical manifold 8 is made of, e.g., stainless steel, and supports the bottom of the process container 4. A wafer boat 12 made of quartz is moved up and down through the bottom port of the manifold 8, so that the wafer boat 12 is loaded/unloaded into and from the process container 4. The wafer boat 12 includes a bottom plate 12a and a top plate 12b between which a number of target substrates or semiconductor wafers W are stacked. For example, in this embodiment, the wafer boat 12 has struts 12A that can support, e.g., about 50 to 100 wafers having a diameter of 300 mm at essentially regular intervals in the vertical direction.

The wafer boat 12 is placed on a table 16 through a heat-insulating cylinder 14 made of quartz. The table 16 is supported by a rotary shaft 20, which penetrates a lid 18 made of, e.g., stainless steel, and is used for opening/closing the bottom port of the manifold 8. In a state where the wafer boat 12 is set in position within the process field 5, as described above, the lower space S1 and upper space S2 of the marginal space respectively correspond to a space below the bottom plate 12a of the wafer boat 12 and a space above the top plate 12b thereof.

The portion of the lid 18 where the rotary shaft 20 penetrates is provided with, e.g., a magnetic-fluid seal 22, so that the rotary shaft 20 is rotatably supported in an airtightly sealed state. A seal member 24, such as an O-ring, is interposed between the periphery of the lid 18 and the bottom of the manifold 8, so that the interior of the process container 4 can be kept sealed.

The rotary shaft 20 is attached at the distal end of an arm 26 supported by an elevating mechanism 25, such as a boat elevator. The elevating mechanism 25 moves the wafer boat 12 and lid 18 up and down in unison. The table 16 may be fixed to the lid 18, so that wafers W are processed without rotation of the wafer boat 12.

A gas supply section is connected to the side of the manifold 8 to supply predetermined process gases to the process field 5 within the process container 4. Specifically, the gas supply section includes a second process gas supply circuit 28, a first process gas supply circuit 30, and a blocking gas supply circuit 32. The first process gas supply circuit 30 is arranged to supply a first process gas containing a silane family gas, such as DCS (dichlorosilane) gas. The second process gas supply circuit 28 is arranged to supply a second process gas containing a nitriding gas, such as ammonia ($NH_3$) gas. Each of the first and second process gas supply circuits 30 and 28 is further arranged to supply an inactive gas alone, such as $N_2$ gas, as a purge gas. The blocking gas supply circuit 32 is arranged to supply an inactive gas, such as $N_2$ gas, as a blocking gas (used as a purge gas, as well). In place of $N_2$ gas, the inactive gas may be another inactive gas, such as He gas, Ar gas, or Ne gas. Each of the first and second process gases may be mixed with a suitable amount of carrier gas, as needed. However, such a carrier gas will not be mentioned, hereinafter, for the sake of simplicity of explanation.

More specifically, the second process gas supply circuit 28 and first process gas supply circuit 30 include gas distribution nozzles 34 and 36, respectively, each of which is formed of a quartz pipe which penetrates the sidewall of the manifold 8 from the outside and then turns and extends upward (see FIG. 1). The gas distribution nozzles 34 and 36 respectively have a plurality of gas spouting holes 34A and 36A, each set being formed at predetermined intervals in the longitudinal direction (the vertical direction) over all the wafers W on the wafer boat 12. The blocking gas supply circuit 32 includes a short gas nozzle 38, which penetrates the sidewall of the manifold 8 from the outside. The gas nozzle 38 has a gas spouting holes 38A opened within the lower space S1 below the bottom plate 12a of the wafer boat 12, in which the heat-insulating cylinder 24 and table 26 are present.

The nozzles 34, 36, and 38 are connected to gas sources 28S, 30S, and 32S of $NH_3$ gas, DCS gas, and $N_2$ gas, respectively, through gas supply lines (gas passages) 42, 44, and 46, respectively. The gas supply lines 42, 44, and 46 are provided with switching valves 42A, 44A, and 46A and flow rate controllers 42B, 44B, and 46B, such as mass flow controllers, respectively. With this arrangement, $NH_3$ gas, DCS gas, and $N_2$ gas can be supplied at controlled flow rates.

A gas exciting section 50 is formed at the sidewall of the process container 4 in the vertical direction. On the side of the process container 4 opposite to the gas exciting section 50, a long and thin exhaust port 52 for vacuum-exhausting the inner atmosphere is formed by cutting the sidewall of the process container 4 in, e.g., the vertical direction.

Specifically, the gas exciting section 50 has a vertically long and thin opening formed by cutting a predetermined width of the sidewall of the process container 4, in the vertical direction. The opening is closed by a partition plate 54 having a gas passage 55 and is covered with a quartz cover 56 airtightly connected to the outer surface of the process container 4. The cover 56 has a vertically long and thin shape with a concave cross-section, so that it projects outward from the process container 4. The process container 4, the partition plate 54, and the cover 56 of the gas exciting section 50 are made of the same insulative material (specifically, quartz), and are connected to each other by welding. The partition plate 54 is fixed to the wall defining the opening formed in the process container 4 while the cover 56 is fixed to the outer surface of the process container 4.

With this arrangement, the gas exciting section 50 is formed such that it projects outward from the sidewall of the process container 4 and is connected on the other side to the interior of the process container 4. In other words, the inner space of the gas exciting section 50 communicates through the gas passage 55 of the partition plate 54 with the process field 5 within the process container 4. The partition plate 54 has a vertical length sufficient to cover all the wafers W on the wafer boat 12 in the vertical direction.

A pair of long and thin electrodes 58 are disposed on the opposite outer surfaces of the cover 56, and face each other while extending in the longitudinal direction (the vertical direction). The electrodes 58 are connected to an RF (Radio Frequency) power supply 60 for plasma generation, through feed lines 62. An RF voltage of, e.g., 13.56 MHz is applied to the electrodes 58 to form an RF electric field for exciting plasma between the electrodes 58. The frequency of the RF voltage is not limited to 13.56 MHz, and it may be set at another frequency, e.g., 400 kHz.

The gas distribution nozzle 34 of the second process gas is bent outward in the radial direction of the process container 4 and penetrates the partition plate 54, at a position lower than the lowermost wafer W on the wafer boat 12. Then, the gas distribution nozzle 34 vertically extends at the deepest position (the farthest position from the center of the process container 4) in the gas exciting section 50. As also shown in FIG. 2, the gas distribution nozzle 34 is separated outward from an area sandwiched between the pair of electrodes 58 (a position where the RF electric field is most intense), i.e., a plasma generation area PS where the main plasma is actually generated. The second process gas containing $NH_3$ gas is spouted from the gas spouting holes 34A of the gas distribution nozzle 34 toward the plasma generation area PS. Then, the second process gas is excited (decomposed or activated) in the plasma generation area PS, and is supplied in this state through the gas passage 55 of the partition plate 54 onto the wafers W on the wafer boat 12.

An insulating protection cover 64 made of, e.g., quartz is attached to and covers the outer surface of the cover 56. A cooling mechanism (not shown) is disposed in the insulating protection cover 64 and comprises coolant passages respectively facing the electrodes 58. The coolant passages are supplied with a coolant, such as cooled nitrogen gas, to cool the electrodes 58. The insulating protection cover 64 is covered with a shield (not shown) disposed on the outer surface to prevent RF leakage.

The gas distribution nozzle 36 of the first process gas extends upward at a position near and outside the partition plate 54 of the gas exciting section 50, i.e., outside the gas exciting section 50 (inside the process container 4). The first process gas containing DCS gas is spouted from the gas spouting holes 36A of the gas distribution nozzle 36 toward the center of the process container 4. The gas spouting holes 36A are formed at positions between the wafers W on the wafer boat 12 to deliver the first process gas (containing DCS) essentially uniformly in the horizontal direction, so as to form gas flows parallel with the wafers W.

The partition plate 54 has a gas passage 55 formed therein for the plasma generation area SP to communicate with the process field 5. The gas passage 55 consists of a number of gas diffusion holes 55A having a circular shape. The gas diffusion holes 55A are arrayed in one vertical row at predetermined intervals in the longitudinal direction (the vertical direction) of the partition plate 54 over all the wafers W on the wafer boat 12. The gas diffusion holes 55A are formed at positions between the wafers W on the wafer boat 12, at the same regular intervals as the intervals of the wafers W. The gas diffusion holes 55A allow the second process gas (containing $NH_3$) activated by plasma to pass therethrough essentially uniformly in the horizontal direction, so as to form gas flows parallel with the wafers W.

The partition plate 54 decreases the gas flow conductance between the plasma generation area SP and process field 5. Consequently, the pressure of the plasma generation area SP can be increased without adversely affecting the process field 5 in terms of pressure. It follows that the plasma generation efficiency can be improved, and the wall surface defining the gas exciting section 50 is less sputtered by plasma ions.

On the other hand, the exhaust port 52, which is formed opposite the gas exciting section 50, is covered with an exhaust port cover member 66. The exhaust port cover member 66 is made of quartz with a U-shape cross-section, and attached by welding. The exhaust port cover member 66 extends upward along the sidewall of the process container 4, and has a gas outlet 68 at the top of the process container 4. The gas outlet 68 is connected to a vacuum-exhaust system GE including a vacuum pump and so forth. The vacuum exhaust system GE has an exhaust passage 84 connected to the gas outlet 68, on which a valve unit (an opening degree adjustment valve) 86, a vacuum pump 88, and a detoxification unit 89 for removing undesirable substances are disposed in this order from the upstream side.

The process container 4 is surrounded by a heater 70, which is used for heating the atmosphere within the process container 4 and the wafers W. A thermocouple (not shown) is disposed near the exhaust port 52 in the process container 4 to control the heater 70.

The film formation apparatus 2 further includes a main control section 48 formed of, e.g., a computer, to control the entire apparatus. The main control section 48 can control the film formation process described below in accordance with the process recipe of the film formation process concerning, e.g., the film thickness and composition of a film to be formed, stored in the memory thereof in advance. In the memory, the relationship between the process gas flow rates and the thickness and composition of the film is also stored as control data in advance. Accordingly, the main control section 48 can control the elevating mechanism 25, gas supply circuits 28, 30, and 32, exhaust system GE (including the valve unit 86), gas exciting section 50, heater 70, and so forth, based on the stored process recipe and control data.

Next, an explanation will be given of a film formation method (so called ALD (Atomic Layer Deposition) film formation) performed in the apparatus shown in FIG. 1. In summary, this film formation method is arranged to selectively supply a first process gas containing dichlorosilane (DCS) gas as a silane family gas and a second process gas containing ammonia ($NH_3$) gas as a nitriding gas to the process field 5 accommodating wafers W to form a silicon nitride film on the wafers W by CVD.

At first, the wafer boat 12 at room temperature, which supports a number of, e.g., 50 to 100, wafers having a diameter of 300 mm, is loaded into the process container 4 heated at a predetermined temperature. Then, the interior of the process container 4 is vacuum-exhausted and kept at a predetermined process pressure, and the wafer temperature is increased to a process temperature for film formation. At this time, the apparatus is in a waiting state until the temperature becomes stable. Then, the first process gas containing DCS gas and the second process gas containing $NH_3$ gas are intermittently supplied from the respective gas distribution nozzles 36 and 34 at controlled flow rates. Further, the blocking gas or purge gas consisting of $N_2$ gas is supplied from the gas nozzle 38 in a manner described below.

Specifically, the first process gas containing DCS gas is supplied from the gas spouting holes 36A of the gas distribution nozzle 36 to form gas flows parallel with the wafers W on the wafer boat 12. While being supplied, molecules of DCS gas and molecules and atoms of decomposition products generated by its decomposition are adsorbed on the wafers W.

On the other hand, the second process gas containing $NH_3$ gas is supplied from the gas spouting holes 34A of the gas distribution nozzle 34 to form horizontal gas flows toward the partition plate 54. The second process gas is selectively excited and partly turned into plasma when it passes through the plasma generation area PS between the pair of electrodes 58. At this time, for example, radicals (activated species), such as $N^*$, $NH^*$, $NH_2^*$, and $NH_3^*$, are produced (the symbol [*] denotes that it is a radical). The radicals flow out from the gas passage 55 of the partition plate 54 of the gas exciting section 50 toward the center of the process container 4, and are supplied into gaps between the wafers W in a laminar flow state.

The radicals react with molecules of DCS gas adsorbed on the surface of the wafers W, so that a silicon nitride film is formed on the wafers W. Alternatively, when DCS gas flows onto radicals adsorbed on the surface of the wafers W, the same reaction is caused, so a silicon nitride film is formed on the wafers W.

When each of the first process gas and second process gas is supplied to the process field 5, the blocking gas consisting of an inactive gas is simultaneously supplied to the lower space S1, which belongs to the marginal space, from the gas spouting hole 38A of the gas nozzle 38. Consequently, each of the first process gas and second process gas is inhibited from flowing into the lower space S1, thereby improving the process throughput, the process gas usage rate, and the planar uniformity and/or inter-substrate uniformity of the process.

Specifically, where the blocking gas is supplied to the lower space S1, not only each of the first process gas and second process gas is inhibited from flowing into the lower space S1, but also the process gas having flowed thereinto can be swiftly exhausted. Consequently, it is possible to shorten the time necessary for removing the process gas, thereby improving the throughput. Further, since the process gas is inhibited from flowing into the lower space S1 by the blocking gas, useless consumption of the process gas, which is relatively expensive, is decreased. Consequently, it is possible to improve the process gas usage rate and to decrease the running cost. Furthermore, since the process gas is inhibited from flowing into the lower space S1, the process gas can flow more uniformly relative to the surface of the wafers. Consequently, it is possible to improve the planar uniformity and/or inter-substrate uniformity of the process.

Figure 3:
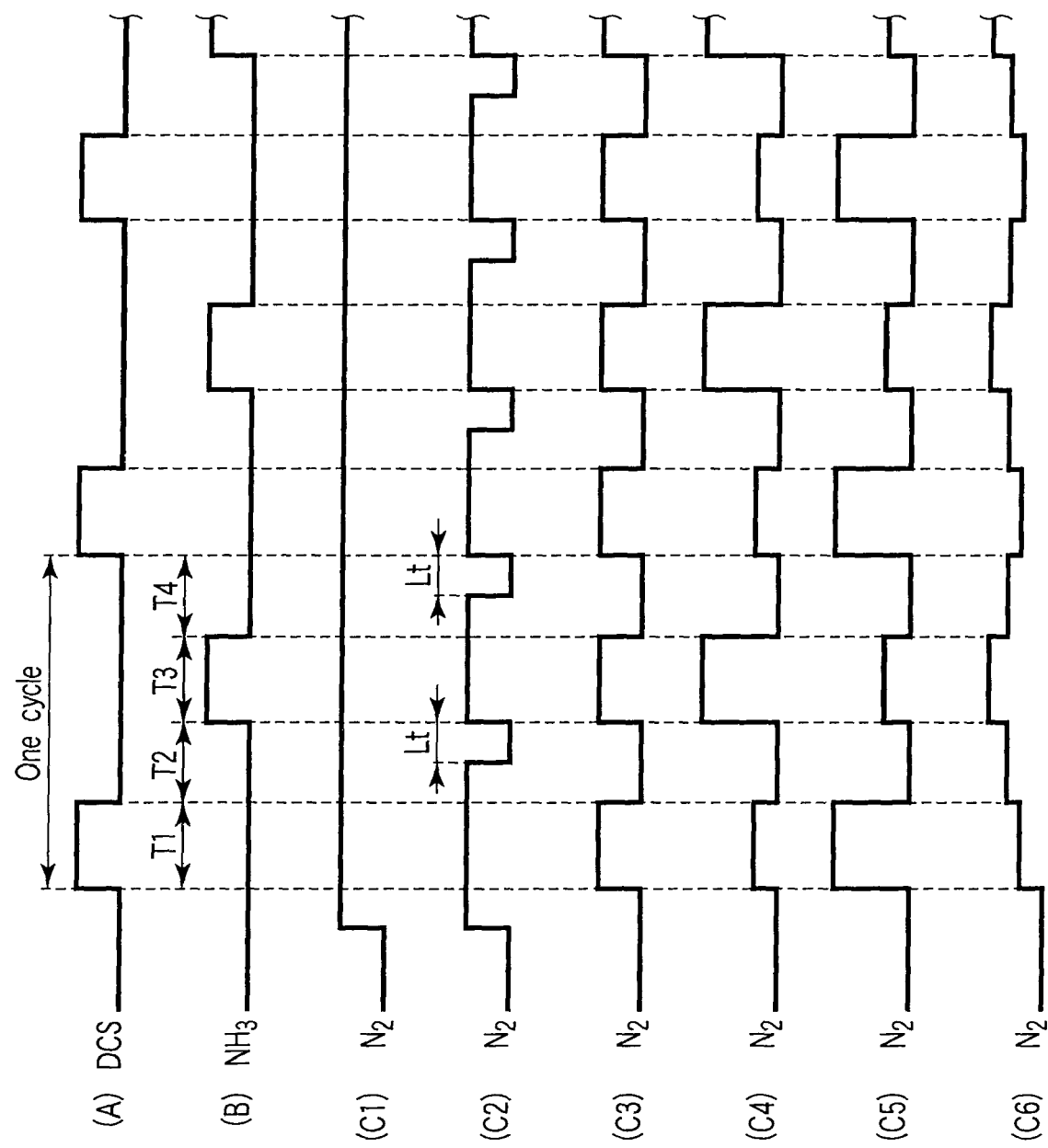
FIG. 3 is a timing chart of the gas supply of a film formation method according to the first embodiment of the present invention.

FIG. 3 is a timing chart of the gas supply of a film formation method according to the first embodiment of the present invention. In this embodiment, the blocking gas also serves as a purge gas, and this gas may be supplied in a manner selected from various manners described later. In FIG. 3, (A) and (B) respectively show supply of the first process gas (denoted as DCS in FIG. 3) and second process gas (denoted as $NH_3$ in FIG. 3) to the process field 5. Further, (C1) to (C6) shows six different examples of supply of the blocking gas (denoted as $N_2$ in FIG. 3) to the lower space S1.

As shown in FIG. 3, the film formation method according to this embodiment is arranged to alternately repeat first to fourth steps T1 to T4. A cycle comprising the first to fourth steps T1 to T4 is repeated a number of times, and thin films of silicon nitride formed by respective cycles are laminated, thereby arriving at a silicon nitride film having a target thickness. At first, a process adopting a first example (C1) of supply of the blocking gas will be explained.

The first step T1 is arranged to perform supply of the first process gas to the process field 5, while stopping supply of the second process gas to the process field 5. The second step T2 is arranged to stop supply of the first and second process gases to the process field 5. The third step T3 is arranged to perform supply of the second process gas to the process field 5, while stopping supply of the first process gas to the process field 5. Further, in the third step T3, the RF power supply 60 is set in the ON state to turn the second process gas into plasma by the gas exciting section 50, so as to supply the second process gas in an activated state to the process field 5. The fourth step T4 is arranged to stop supply of the first and second process gases to the process field 5. According to the first example (C1), supply of the blocking gas to the lower space S1 is continuously performed over the entirety of the first step to fourth step at the same flow rate. Further, preferably, the process field 5 is continuously vacuum-exhausted by the vacuum exhaust system GE through the exhaust passage 84 over the entirety of the first step T1 to the fourth step T4.

Each of the second and fourth steps T2 and T4 is used as a purge step to remove the residual gas within the process container 4. The term "purge" means removal of the residual gas within the process container 4 by vacuum-exhausting the interior of the process container 4 while supplying an inactive gas, such as $N_2$ gas, into the process container 4 (this corresponds to the first example (C1)), or by vacuum-exhausting the interior of the process container 4 while stopping supply of all the gases. In this respect, the second and fourth steps T2 and T4 may be arranged such that the first half utilizes only vacuum-exhaust and the second half utilizes both vacuum-exhaust and inactive gas supply. Further, the first and third steps T1 and T3 may be arranged to stop vacuum-exhausting the process container 4 while supplying each of the first and second process gases. However, where supplying each of the first and second process gases is performed along with vacuum-exhausting the process container 4, the interior of the process container 4 can be continuously vacuum-exhausted over the entirety of the first to fourth steps T1 to T4.

The first step T1 is set to be within a range of about 1 to 120 seconds, e.g., at about 5 seconds. The second step T2 is set to be within a range of about 1 to 30 seconds, e.g., at about 5 seconds. The third step T3 is set to be within a range of about 1 to 120 seconds, e.g., at about 10 seconds. The fourth step T4 is set to be within a range of about 1 to 30 seconds, e.g., at about 5 seconds. In general, the film thickness obtained by one cycle of the first to fourth steps T1 to T4 is about 0.05 to 0.11 nm. Accordingly, for example, where the target film thickness is 50 nm, the cycle is repeated about 500 times. However, these values of time and thickness are mere examples and thus are not limiting.

As described above, where the blocking gas is supplied to the lower space S1, not only each of the first process gas and second process gas is inhibited from flowing into the lower space S1, but also the process gas having flowed thereinto can be swiftly exhausted. For example, it is assumed that a film formation process is arranged to repeat 500 times a cycle comprising the first to fourth steps T1 to T4. In this case, if the gas purge operation of each cycle is shortened by a few seconds, such as 2 seconds, the total film formation time can be shortened by 1,000 seconds (=2×500), thereby improving the throughput.

The flow rate of DCS gas is set to be within a range of 50 to 2,000 sccm, e.g., at 1,000 sccm (1 slm: standard liter per minute). The flow rate of $NH_3$ gas is set to be within a range of 100 to 5,000 sccm, e.g., at 3,000 sccm. The flow rate of $N_2$ gas is set to be within a range of 10 to 30,000 sccm, e.g., at 5,000 sccm. The process temperature is lower than that for ordinary CVD processes, and is set to be within a range of 250 to 700° C., and preferably of 350 to 600° C. If the process temperature is lower than 250° C., essentially no film is deposited because hardly any reaction is caused. If the process temperature is higher than 700° C., a low quality CVD film is deposited, and existing films, such as a metal film, may suffer thermal damage.

The process pressure (the pressure of the process field 5) is set to be within a range of 0.2 to 1 Torr (27 to 133 Pa (1 Torr=133.3 Pa)). This condition can improve the planar uniformity and inter-substrate uniformity in the thickness of a film formed by the plasma film formation. If the process pressure is higher than 1.0 Torr, radicals are deactivated drastically. If the process pressure is lower than 0.2 Torr, the film formation rate becomes lower than the practical level.

On the other hand, the pressure of the plasma generation area SP (the pressure inside the gas exciting section 50) is set to be within a range of, e.g., 0.7 to 5.0 Torr (93 to 667 Pa). If the pressure of the plasma generation area SP is set higher, the plasma generation efficiency can be improved, so the plasma density becomes higher. If the pressure of the plasma generation area SP is higher than 5.0 Torr, the plasma ignition becomes very difficult. If this pressure is lower than 0.7 Torr, the plasma generation efficiency is deteriorated drastically.

FIG. 3 also shows second to sixth examples (C2) to (C6) of supply of the blocking gas different from the first example (C1). However, the manner of supply of the blocking gas is not limited to these examples, and it may be selected from other various manners.

In the second example (C2), each of the second and fourth steps T2 and T4 is arranged to completely stop supply of the blocking gas in the latter half period Lt. Consequently, exhaust of the residual gas within the process container 4 is facilitated. In the third example (C3), each of the second and fourth steps T2 and T4 is arranged to completely stop supply of the blocking gas over the entirety thereof. In this case, consumption of the blocking gas is decreased by that much corresponding to stoppage of supply of the blocking gas. In the fourth example (C4), the flow rate of the blocking gas is set in accordance with the flow rates of the first and second process gases, such that it is smaller when the first process gas is supplied and is larger when the second process gas is supplied. Further, each of the second and fourth steps T2 and T4 is arranged to completely stop supply of the blocking gas over the entirety thereof. In the fifth example (C5), the flow rate of the blocking gas is set in reverse of the fourth example (C4), such that it is larger when the first process gas is supplied and is smaller when the second process gas is supplied. In the sixth example (C6), the flow rate of the blocking gas is varied stepwise in one cycle of the first to fourth steps T1 to T4, such that it reaches the peak when the second process gas is supplied.

Also in these modifications, each of the first process gas and second process gas is inhibited from flowing into the lower space S1, thereby improving the process throughput, the process gas usage rate, and the planar uniformity and/or inter-substrate uniformity of the process.

Experiment 1

Figure 4:
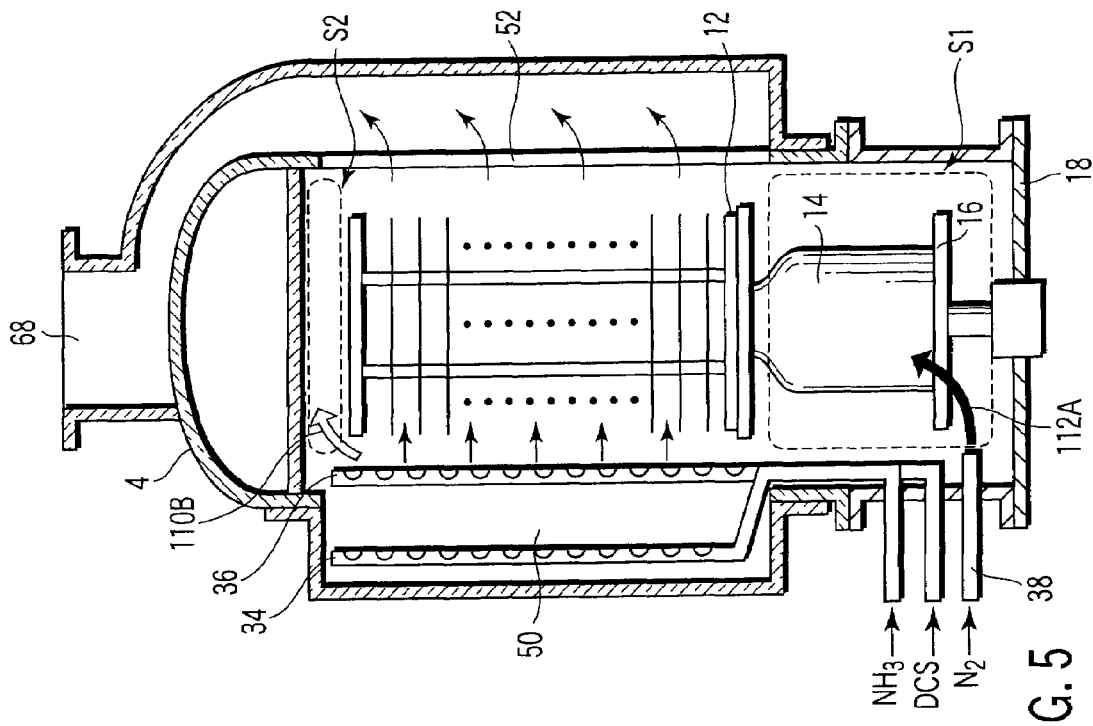
FIG. 4 is a view showing an apparatus (comparative example) used in an experiment wherein no blocking gas is supplied into a lower space S1.
Figure 5:
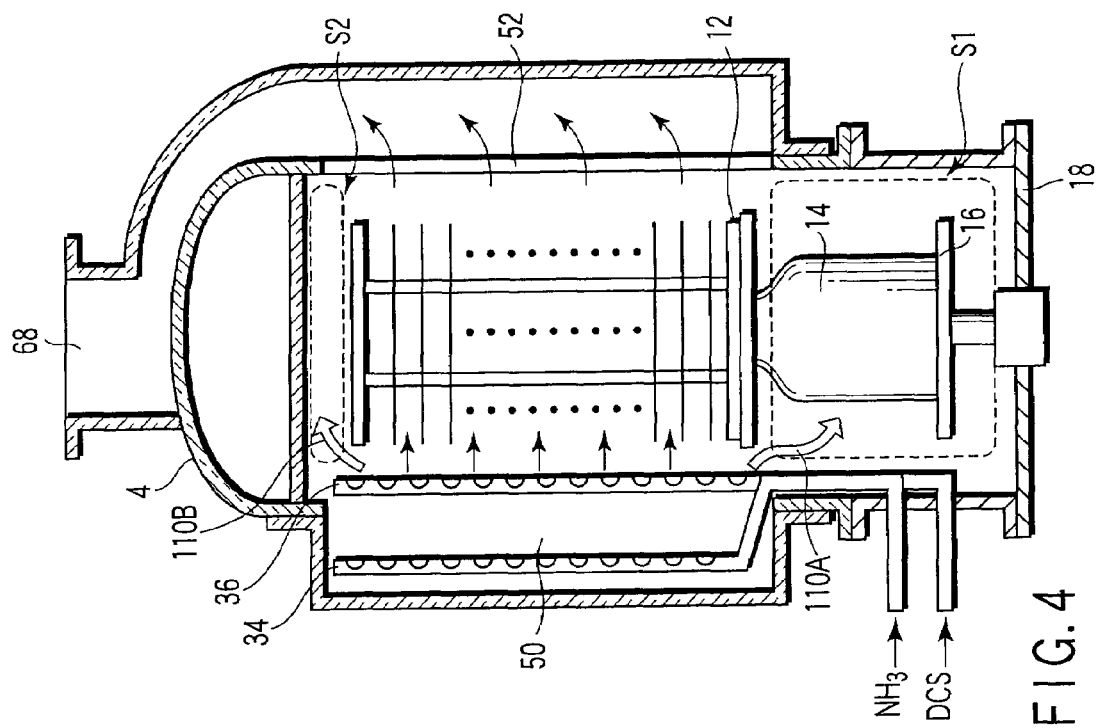
FIG. 5 is a view showing an apparatus (present example) used in an experiment wherein a blocking gas is supplied into a lower space S1.

A comparative experiment was performed between an apparatus (comparative example) shown in FIG. 4 with no blocking gas supplied into the lower space S1 and an apparatus (present example) shown in FIG. 5 with the blocking gas supplied into the lower space S1. In FIGS. 4 and 5, the partition plate 54 is not shown. In this experiment, wafers having a diameter of 200 mm were used as target substrates. The first process gas containing DCS gas was set at a flow rate of 100 sccm. The second process gas containing $NH_3$ gas was set at a flow rate of 500 sccm. In the apparatus shown in FIG. 5, supply of the blocking gas was continuously performed in accordance with the first example (C1) shown in FIG. 3. The $N_2$ used as the blocking gas was set at a flow rate of 1 slm. Under these conditions, a film formation process was performed by repeating 500 times a cycle comprising the first to fourth steps T1 to T4 shown in FIG. 3.

Figure 6:
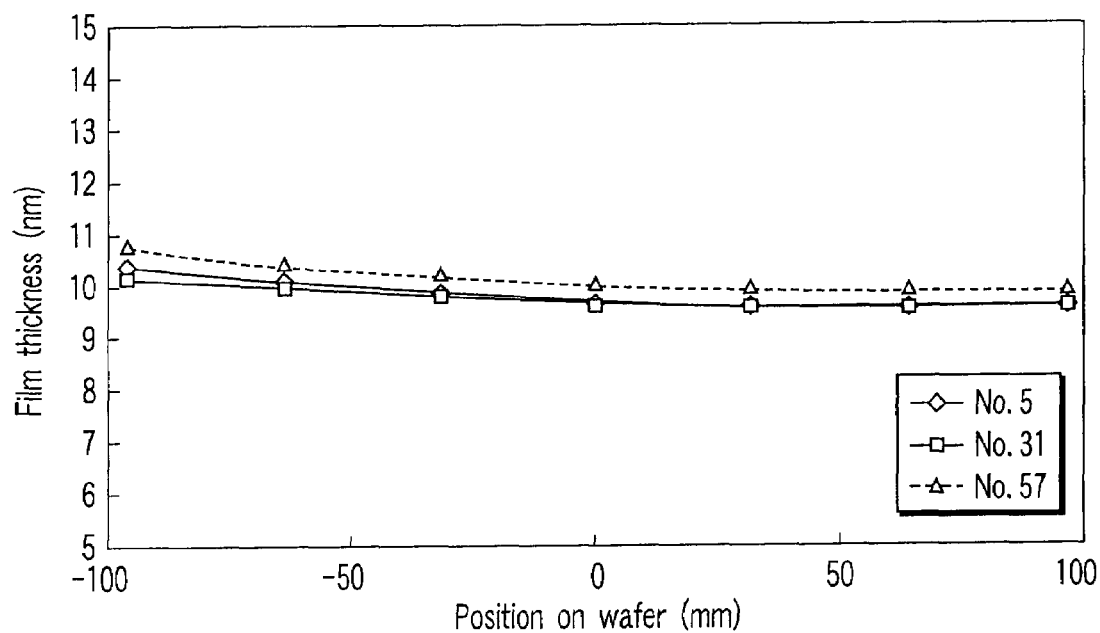
FIG. 6 is a graph showing the relationship between the position on a wafer and the film thickness obtained by the apparatus shown in FIG. 4 in Experiment 1.
Figure 7:
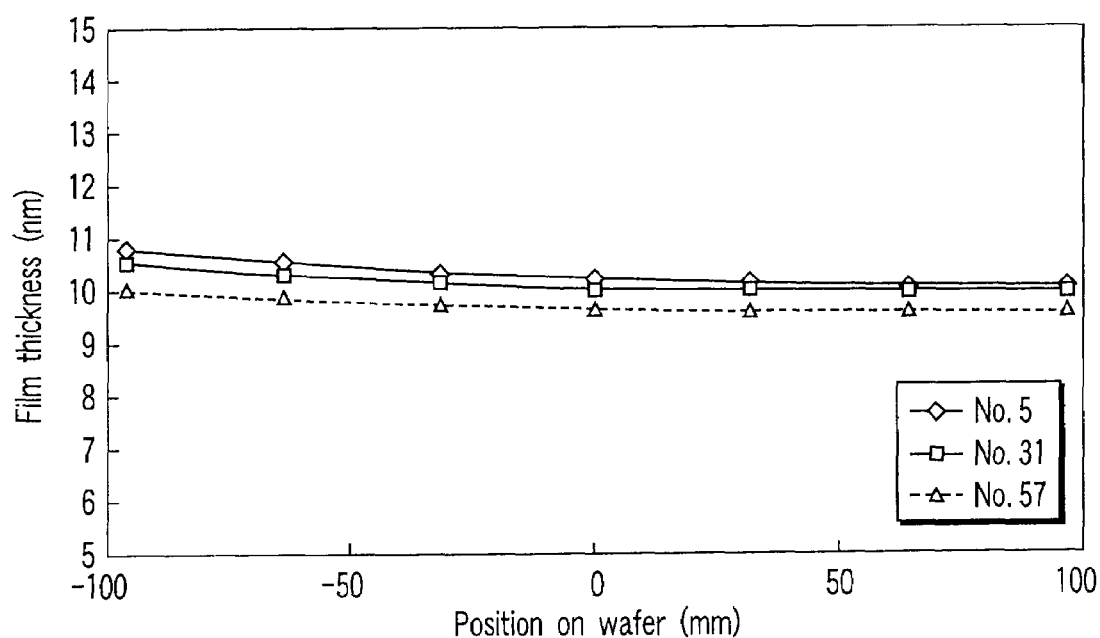
FIG. 7 is a graph showing the relationship between the position on a wafer and the film thickness obtained by the apparatus shown in FIG. 5 in Experiment 1.

FIGS. 6 and 7 are graphs showing the relationship between the position on a wafer and the film thickness obtained by the apparatuses shown in FIGS. 4 and 5, respectively, in Experiment 1. In FIGS. 6 and 7, the horizontal axis denotes the position (mm) on a wafer, and the vertical axis denotes the film thickness (nm). No. 5, No. 31, and No. 57 in FIGS. 6 and 7 denote the number of a wafer of 61 wafers supported on the wafer boat 12, which were counted from below. As shown in FIG. 6, in the case of the comparative example, the planar uniformity of the film thickness on the three wafers were ±4.22%, ±3.88%, and ±4.54%, respectively. On the other hand, as shown in FIG. 7, in the case of the present example, the planar uniformity of the film thickness on the three wafers were ±3.60%, ±2.76%, and ±2.79%, respectively. Accordingly, it has been confirmed that the planar uniformity of the film thickness can be improved without reference to the height position of the wafers.

FIGS. 4 and 5 schematically show gas flows in these apparatuses. As shown in FIG. 4, in the case of the comparative example, the major part of the process gas supplied from each of the gas distribution nozzles 34 and 36 flows in the horizontal direction toward the wafers W, but small parts thereof flow into the lower space S1 and upper space S2, as indicated by arrows 110A and 110B. These small parts may deteriorate the process throughput, the process gas usage rate, and the planar uniformity and/or inter-substrate uniformity of the process. In this case, since the lower space S2 has a volume far lager than the upper space S2, the part of the process gas flowing into the lower space S2 is more influential.

On the other hand, as shown in FIG. 5, in the case of the present example, the blocking gas is directly supplied to the lower space S1 from the blocking gas nozzle 38, as indicated by an arrow 112A. Consequently, the process gas is inhibited from flowing into the lower space S1, thereby improving the problems described above to a large extent. A nozzle structure for supplying the blocking gas to the upper space S2 will be described later.

Experiments 2 and 3

Experiments were performed in the apparatus (present example) shown in FIG. 5, by use of different manners of supply of the blocking gas. Experiments 2 and 3 employed the same conditions as Experiment 1 except that supply of the blocking gas was performed in different manners. In Experiment 2, supply of the blocking gas was performed in accordance with the fourth example (C4) shown in FIG. 3, in which the $N_2$ gas used as the blocking gas was set at a flow rate of 0.2 slm when the first process gas containing DCS gas was supplied (the first step), and at 1 slm when the second process gas containing $NH_3$ gas was supplied (the third step). In Experiment 3, supply of the blocking gas was performed in accordance with the fifth example (C5) shown in FIG. 3, in which the $N_2$ gas used as the blocking gas was set at a flow rate of 1 slm when the first process gas containing DCS gas was supplied (the first step), and at 0.2 slm when the second process gas containing $NH_3$ gas was supplied (the third step).

FIGS. 8 and 9 are graphs showing the relationship between the position on a wafer and the film thickness obtained by the apparatus shown in FIG. 5 in Experiments 2 and 3, respectively. In FIGS. 8 and 9, the horizontal axis denotes the position (mm) on a wafer, and the vertical axis denotes the film thickness (nm). No. 5, No. 31, and No. 57 in FIGS. 8 and 9 denote the number of a wafer of 61 wafers supported on the wafer boat 12, which were counted from below. As shown in FIGS. 8 and 9, the planar uniformity and inter-substrate uniformity of the film thickness was greatly changed due to the different manners of supply of the blocking gas. Accordingly, it has been confirmed that the planar uniformity and inter-substrate uniformity of the film thickness can be controlled by adjusting the flow rate of the blocking gas.

Second Embodiment

Figure 10:
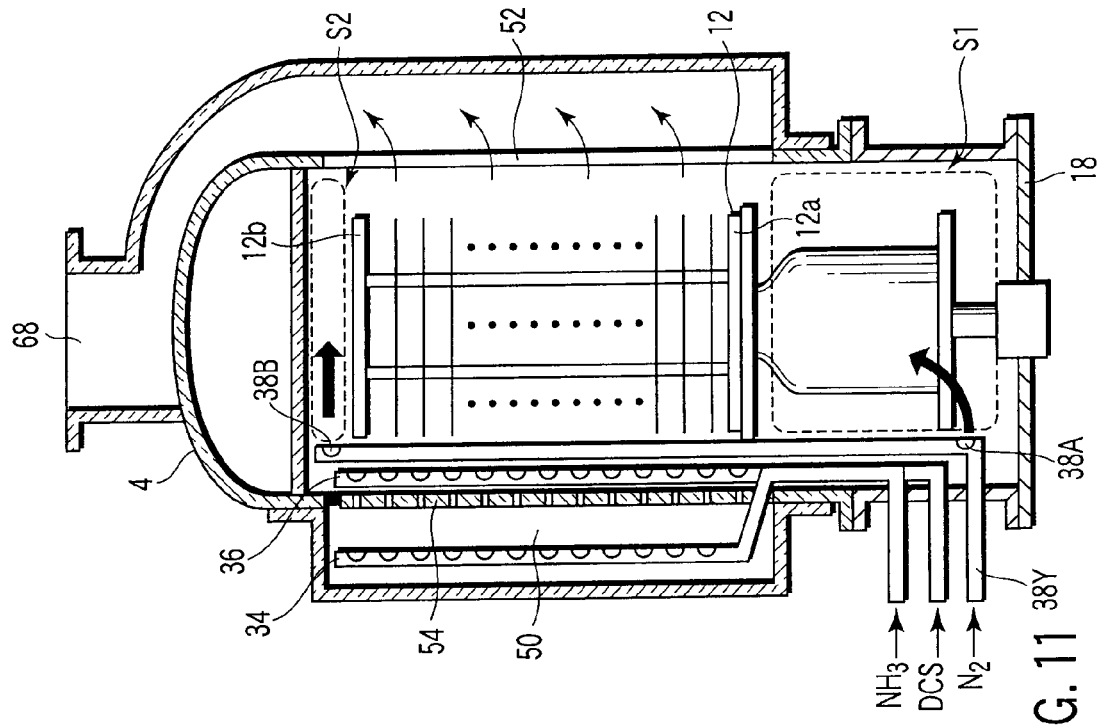
FIG. 10 is a sectional view showing a vertical plasma processing apparatus (vertical plasma film formation apparatus) according to a second embodiment of the present invention.

FIG. 10 is a sectional view showing a vertical plasma processing apparatus (vertical plasma film formation apparatus) according to a second embodiment of the present invention. The apparatus shown in FIG. 10 has the same structure as the apparatus shown in FIG. 1 except for the arrangement concerning the blocking gas supply circuit 32. In the apparatus shown in FIG. 10, the blocking gas supply circuit 32 includes a gas nozzle 38X formed of a quartz pipe which penetrates the sidewall of the manifold 8 from the outside and then turns and extends upward. The distal end of the gas nozzle 38X extends beyond the top plate 12b of the wafer boat 12 and reaches a position near the ceiling of the process container 4. The gas nozzle 38X has a gas spouting holes 38B located above the top plate 12b of the wafer boat 12 and facing the upper space S2, which belongs to the marginal space. In this embodiment, supply of the blocking gas may be performed in accordance with selected one of first to sixth examples (C1) to (C6) shown in FIG. 3.

Third Embodiment

Figure 11:
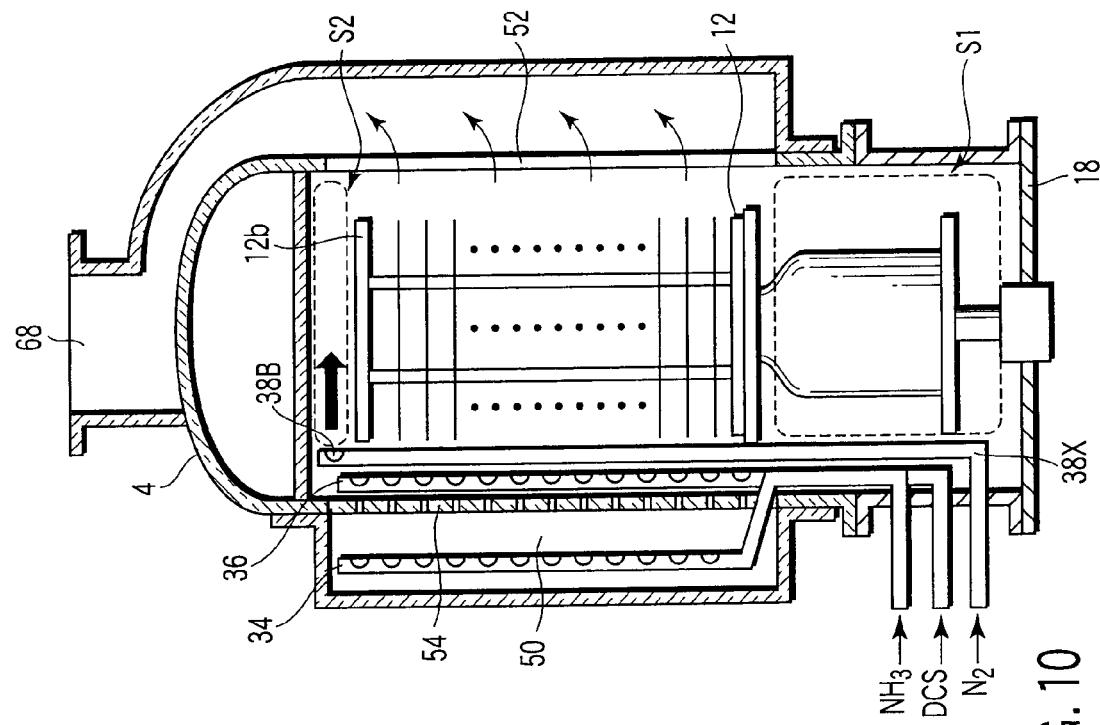
FIG. 11 is a sectional view showing a vertical plasma processing apparatus (vertical plasma film formation apparatus) according to a third embodiment of the present invention.

FIG. 11 is a sectional view showing a vertical plasma processing apparatus (vertical plasma film formation apparatus) according to a third embodiment of the present invention. The apparatus shown in FIG. 11 has the same structure as the apparatus shown in FIG. 1 except for the arrangement concerning the blocking gas supply circuit 32. Also in the apparatus shown in FIG. 11, the blocking gas supply circuit 32 includes a gas nozzle 38Y formed of a quartz pipe which penetrates the sidewall of the manifold 8 from the outside and then turns and extends upward, as in the apparatus shown in FIG. 10. The distal end of the gas nozzle 38Y extends beyond the top plate 12b of the wafer boat 12 and reaches a position near the ceiling of the process container 4. The gas nozzle 38Y has gas spouting holes 38A and 38B respectively located below the bottom plate 12a of the wafer boat 12 and above the top plate 12b of the wafer boat 12 and respectively facing the lower space S1 and upper space S2, which belongs to the marginal space. Also in this embodiment, supply of the blocking gas may be performed in accordance with selected one of first to sixth examples (C1) to (C6) shown in FIG. 3.

According to the third embodiment, the blocking gas is supplied to both the lower space S1 and upper space S2, so that the process gas is inhibited from flowing into these spaces. Consequently, it is possible to further improve the process throughput, the process gas usage rate, and the planar uniformity and/or inter-substrate uniformity of the process. In the third embodiment, two blocking gas nozzles may be respectively disposed exclusively for the lower space S1 and upper space S2 to supply the blocking gas therefrom to the respective spaces.

<Modification>

In the embodiments described above, the first process gas (containing DCS) that provides the main material of a thin film is not turned into plasma, and the second process gas (containing $NH_3$) that reacts with the first process gas is turned into plasma. However, depending on the type of CVD, only a gas that provides the main material of a thin film may be turned into plasma, or both of a gas that provides the main material of a thin film and a gas that reacts with the former gas may be turned into plasma.

In the embodiments, for example, the first process gas contains DCS gas as a silane family gas. In this respect, the silane family gas may be one or more gases selected from the group consisting of dichlorosilane (DCS), hexachlorodisilane (HCD), monosilane ($SiH_4$), disilane ($Si_2Cl_6$), hexamethyldisilazane (HMDS), tetrachlorosilane (TCS), disilylamine (DSA), trisilylamine (TSA), and bistertialbutylaminosilane (BTBAS).

In the embodiments, the second process gas contains ammonia ($NH_3$) gas as a nitriding gas. Where the present invention is applied to formation of a silicon oxynitride film, an oxynitriding gas, such as dinitrogen oxide ($N_2O$) or nitrogen oxide (NO), may be used in place of the nitriding gas. Where the present invention is applied to formation of a silicon oxide film, an oxidizing gas, such as oxygen ($O_2$) or ozone ($O_3$), may be used in place of the nitriding gas.

In addition to the process gases described above, an impurity gas, such as $BCl_3$ gas, for introducing an impurity, and/or a carbon hydride gas, such as ethylene, for adding carbon may be further used. The present invention may be applied to another film formation process, such as a plasma CVD process, in place of the ALD process as described above. Further, the present invention may be applied to another plasma process, such as a plasma etching process, plasma oxidation/diffusion process, or plasma reformation process, in place of a plasma film formation process as described above. Further, the present invention may be applied to another target substrate, such as a glass substrate or ceramic substrate, in place of a semiconductor wafer as described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for forming a silicon-containing insulating film in a vertical plasma processing apparatus for a semiconductor process, the apparatus comprising:
    a support member including a bottom plate and a top plate and configured to support a plurality of target substrates at intervals in a vertical direction;
    a process container configured to accommodate the support member with the target substrates supported thereon and having a process field, which has lower and upper ends defined by the bottom and top plates of the support member, respectively, for processing the target substrates, and a marginal space out of the process field, which comprises one or both of a lower space and an upper space respectively present below the bottom plate and above the upper plate;
    a heater configured to heat the target substrates inside the process field;
    an exciting mechanism including a plasma generation area disposed in a space communicating with the process field, the plasma generation area extending over a length corresponding to the process field in a vertical direction;
    a process gas supply system configured to selectively supply into the process field a first process gas containing a silicon-containing gas and a second process gas containing a reactive gas selected from the group consisting of nitriding gases, oxynitriding gases, and oxidizing gases, such that the first process gas is supplied into the process field not through the plasma generation area, and the second process gas is supplied into the process field through the plasma generation area, and the first and second process gases are supplied to form essentially horizontal gas flows in the process field over a length corresponding to the process field in a vertical direction;
    a blocking gas supply circuit including a blocking gas supply port independent of the process gas supply system and configured to directly supply a blocking gas comprising an inactive gas into the marginal space, the blocking gas supply port being located at a position on the same side as the exciting mechanism and opened to the marginal space; and
    an exhaust system including an exhaust port disposed at a position facing the plasma generation area with the process field interposed there between and configured to exhaust gas from the process field and thereby to exhaust the process gas and the blocking gas,
    the method being preset to deposit the silicon-containing insulating film by repeating a process cycle a plurality of times, the process cycle alternately comprising:
    a first step of performing supply of the first process gas to the process field while maintaining s shut-off state of supply of the second process gas to the process field;
    a second step of maintaining a shut off state of supply of the first and second process gases to the process field;
    a third step of performing supply of the second process gas to the process field while maintaining a shut-off state of supply of the first process gas to the process field, the third step including an excitation period of supplying the second process gas to the process field while exciting the second process gas by the exciting mechanism, and
    a fourth step of maintaining a shut off state of supply of the first and second process gases to the process gases to the process field;
    wherein the process cycle comprises
    continuously exhausting gas from inside the process field through the exhaust port over the first, second, third, and fourth steps, and
    performing supply of the blocking gas to the marginal space from the blocking gas supply port simultaneously with the supply of the first and second process gases to the process field in the first and third steps, respectively, to inhibit the first and second process gases from flowing into the marginal space.

2. The method according to claim 1, wherein the process cycle is arranged such that one of the first and second process gases is supplied at a smaller flow rate than the other of the first and second process gases is, and the blocking gas supplied simultaneously with said one of the first and process second process gases is supplied at a larger flow rate than the blocking gas supplied simultaneously with said other of the first and second process gases is.

3. The method according to claim 2, wherein the first process gas is supplied at a smaller flow rate than the second process gas is.

4. The method according to claim 1, wherein the process cycle is arranged to continuously perform supply of the blocking gas to the marginal space from the blocking gas supply port over the first, second, third and fourth steps.

5. The method according to claim 1, wherein the process cycle is arranged to maintain a shut off state of supply of the blocking gas to the marginal space from the blocking gas supply port during each of the second and fourth steps.

6. The method according to claim 1, wherein the process cycle is arranged such that each of the second and fourth steps has a preceding period and a subsequent period which respectively perform and stop supply of the blocking gas to the marginal space from the blocking gas supply port.

7. The method according to claim 1, wherein the exhaust port extends over a length corresponding to the process field in a vertical direction.

8. The method according to claim 1, wherein the marginal space comprises the lower space, and the blocking gas supply port comprises a lower supply port opened to the lower space.

9. The method according to claim 1, wherein the marginal space comprises the lower space and the upper space, and the blocking gas supply port comprises a lower supply port and an upper supply port respectively opened to the lower space and the upper space.

10. The method according to claim 1, wherein the blocking gas comprises a gas selected from the group consisting of $N_2$, He, Ar, and Ne.

11. The method according to claim 1, wherein the silicon-containing gas comprises a gas selected from the group consisting of dichlorosilane (DCS), hexachlorodisilane (HCD), monosilane ($SiH_4$), disilane ($Si_2Cl_6$), hexamethyldisilazane (HMDS), tetrachlorosilane (TCS), disilylamine (DSA), trisilylamine (TSA), and bistertialbutylaminosilane (BTBAS).

12. The method according to claim 1, wherein the reactive gas comprises a gas selected from the group consisting of ammonia ($NH_3$), dinitrogen oxide ($N_2O$), nitrogen oxide (NO), oxygen ($O_2$), and ozone ($O_3$).

* * * * *